United States Patent [19]

Hosogai

[11] Patent Number: 4,623,607
[45] Date of Patent: Nov. 18, 1986

[54] PROCESS OF FORMING A PHOTORESIST PATTERN AND APPARATUS FOR CORRECTING THE PATTERN

[75] Inventor: Kozo Hosogai, Ebina, Japan

[73] Assignee: Fuji Xerox Co., Ltd., Tokyo, Japan

[21] Appl. No.: 643,088

[22] Filed: Aug. 21, 1984

Related U.S. Application Data

[63] Continuation of Ser. No. 480,852, Mar. 31, 1983, abandoned.

[30] Foreign Application Priority Data

Apr. 6, 1982 [JP] Japan .................................. 57-56975

[51] Int. Cl.⁴ .............................................. G03C 5/00
[52] U.S. Cl. .................................... 430/312; 430/325; 430/331; 430/394; 427/140
[58] Field of Search ................... 430/5, 312, 394, 325, 430/326, 331; 427/140

[56] References Cited

U.S. PATENT DOCUMENTS 3,317,320 5/1967 Reber .................................. 430/325
3,748,975 7/1973 Tarabocchia ...................... 430/5 X
3,843,362 10/1974 Di Fazio et al. ......................... 430/5

Primary Examiner—John E. Kittle
Assistant Examiner—José G. Dees
Attorney, Agent, or Firm—Spensley Horn Jubas & Lubitz

[57] ABSTRACT

A process of forming a photoresist pattern and apparatus for correcting the pattern is for correcting defects in a photoresist pattern after the pattern is formed. In this process, after the photoresist pattern is formed, defects in the pattern is detected. For negative type defects photoresist material is selectively dropped onto the defects to coat them with the material and for positive type defects light is selectively irradiated through light shielding masks onto the defects, which are then developed to remove the defects.

The apparatus includes a photoresist coating device which discharges photoresist material utilizing piezoelectric effect.

3 Claims, 17 Drawing Figures

PROCESS OF FORMING A PHOTORESIST PATTERN AND APPARATUS FOR CORRECTING THE PATTERN

This is a continuation of application Ser. No. 480,852, filed Mar. 31, 1983, abandoned.

BACKGROUND OF THE INVENTION

1. Field of the Invention

The present invention relates to forming of a photoresist pattern in the manufacturing of semiconductor devices such as IC and LSI, and in particular, to a defect correction process of photoresist patterns and an apparatus for correcting the defect of the pattern.

2. Description of the Prior Art

Figure 1:
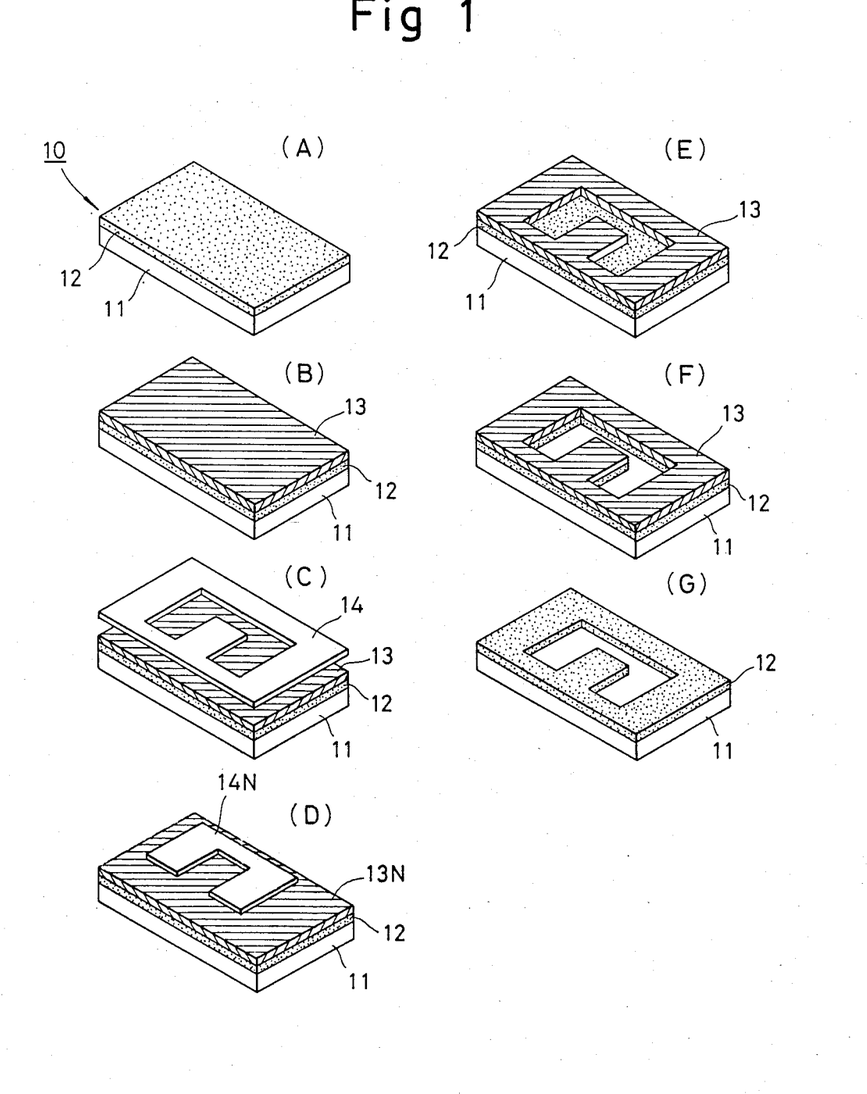

A typical conventional photoresist forming process in the manufacture of semiconductors and the like has been generally as shown in FIG. 1 (A) through (G). A substrate 10, which is the object of photoetching, consists of a base 11 and a film 12 to which a pattern is formed (refer to FIG. 1 (A)). The film 12 is first subjected to heat treatment so that the film may obtain highly adherent property to a photoresist of positive type and easy removing nature of adsorbates. Then, as shown in FIG. 1 (B), a photoresist layer 13 is applied over the film 12, and prebaking is performed to remove solvent remaining in the photoresist layer 13.

Then, as shown in FIG. 1 (C), exposure is performed through a suitable mask 14. When the photoresist layer 13 is of the negative type, a mask 14N is used (refer to FIG. 1 (D)). After the exposure, development is performed using a suitable solvent, and the photoresist layer 13 is formed corresponding to the pattern of the mask 14 (or the mask 14N) (refer to FIG. 1 (E)). Thereafter, post-baking is performed to strengthen the adherence between the photoresist layer 13 and the film 12, and the etching is further performed, with the resultant state as shown in FIG. 1 (F). As a remaining photoresist material is removed, the film 12 is eventually formed corresponding to the pattern of the mask 14 as shown in FIG. 1 (G).

Figure 2:
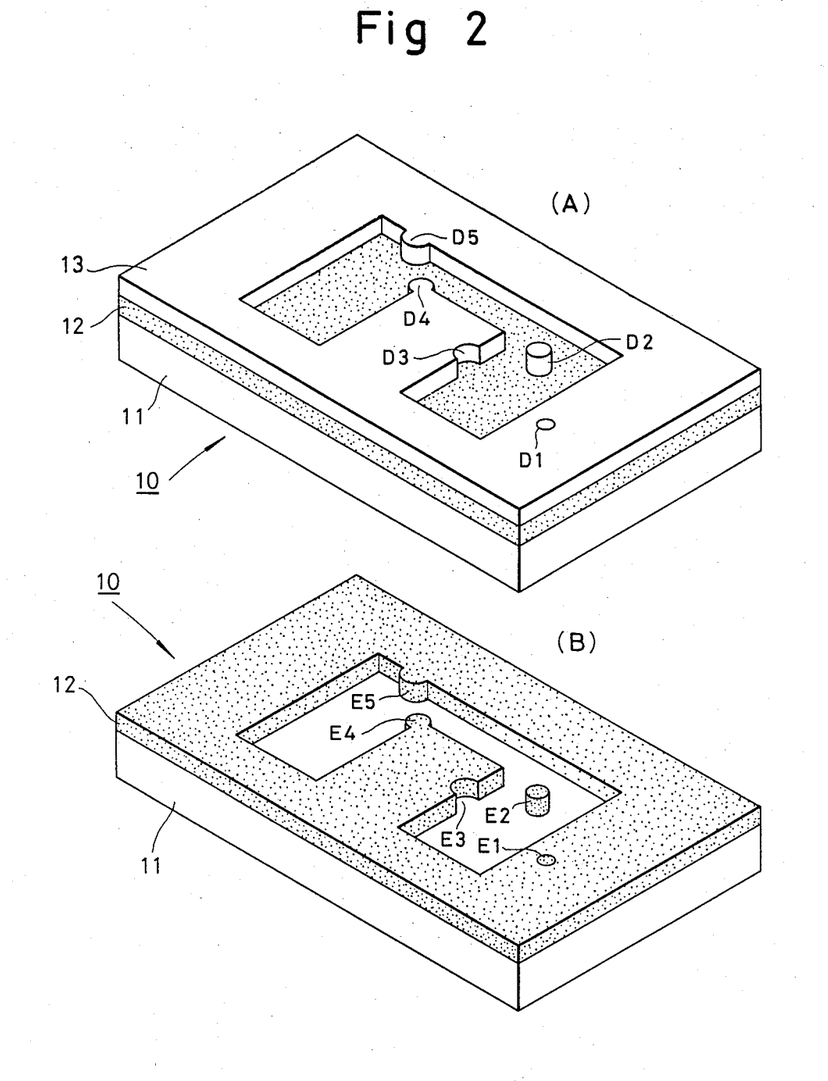

If defects D1 through D5 as shown in FIG. 2 (A) exist in the photoresist pattern shown in FIG. 1 (E), defects E1 through E5 as shown in FIG. 2 (B) will appear in the pattern of the film 12. The presence of such defects E1 through E5 is not permissible in a substrate particularly when the substrate is to be used for a thermal head or a large area image sensor wherein the substrate has a large area and the whole area of the substrate works as a single functional element.

On the other hand, when the area of a device is large, it is likely that such defects E1 through E5 may appear anywhere, hence making it necessary to take a measure for correcting photoresist pattern to improve the yield of devices.

There have been proposed such measures as performing the photoresist pattern forming steps twice, making the positive type photoresist and the negative type resist two layers, and other methods. However, satisfactory correction for photoresist patterns has not been able to be made because no consideration has been given to the kinds of the defects D1 through D5 and the quantity of defects in such measures.

SUMMARY OF THE INVENTION

The present invention has been conceived based on the above-mentioned situation, and it is an object of this invention to provide a process of forming a photoresist pattern and an apparatus for correcting defect, of the photoresist pattern, which is capable of obtaining excellent etching patterns preventing new occurrence of defects in the photoresist pattern correction process, and improving the yield in the production of devices.

In the present invention, considering the peculiarity of defects existing in the photoresist pattern, in order to correct the photoresist pattern the dropping or applying of the photoresist is performed for one type of defects where photoresist material lacks, and selective exposure is performed on the unnecessary photoresist in the other type of defects thus making it possible to enhance the accuracy in the etching pattern fabrication.

According to the pattern correction method of the present invention, of all defects in a photoresist pattern, for the negative type defects the photoresist material is selectively dropped to coat the defects, and for the positive type defects selective exposure is performed to remove the defects, thus making it possible to obtain a desired resist pattern with resultant superior etching patterns, as a result of reduction of occurrence of new defects in the resist pattern correction process and ultimately leading to such excellent effect as the improvement of yield in the production of device.

Particularly, more excellent effect may be obtained when the pattern to be corrected is formed by the positive type photoresist layer, and the positive type photoresist material is used for correction.

The pattern correction process and apparatus according to the present invention will be described in detail with reference to the attached drawings in which the preferred embodiment is illustrated by way of example.

BRIEF DESCRIPTION OF THE DRAWINGS

In the accompanying drawings:

FIGS. 1 (A) through 1 (G) are perspective views showing each step of photoresist pattern formation in a conventional photoetching process;

FIGS. 2 (A) and 2 (B) are perspective views of the generation of defects;

FIGS. 5 (A) through 5 (E) are plan views showing examples of resist pattern correction and exposure mask arrangement.

DETAILED DESCRIPTION OF THE PREFERRED EMBODIMENT

Figure 3:
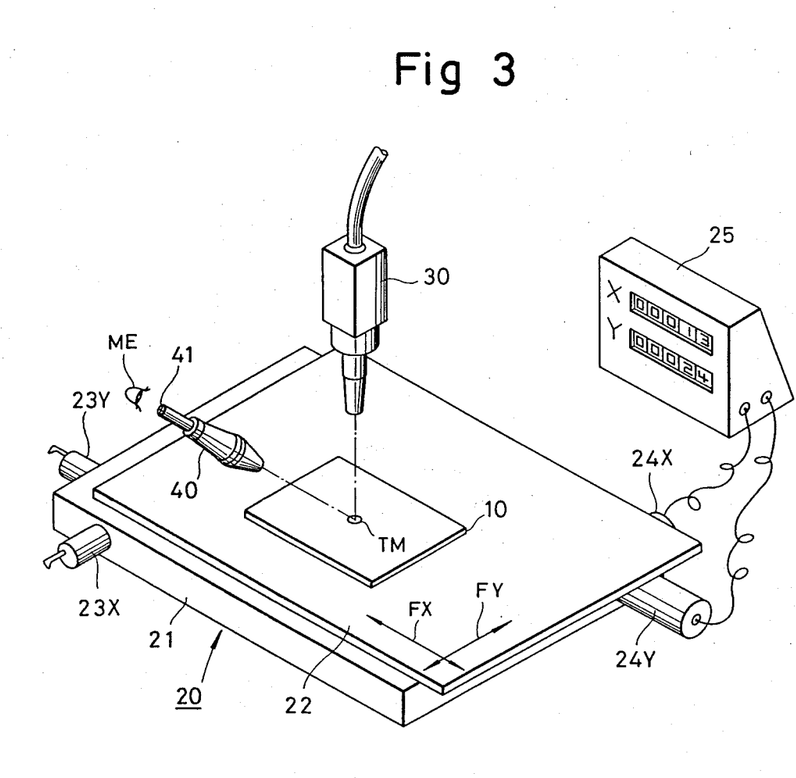
FIG. 3 is a perspective view showing a typical configuration of the photoresist applying device according to the present invention.

FIG. 3 illustrates a typical configuration of a photoresist applying device 20 according to the present invention for selectively applying a photoresist material for correction to defective parts, which is used in the present invention. Referring to FIG. 3, the photoresist applying device 20 is provided with a stage 22 which is movable on a base 21, in the directions of the arrows FY and FX, and the stage 22 is designed to move over the base 21 according to the operation of handles 23X and 23Y. The travel distance of movement is measured by micrometers 24X and 24Y, and displayed on a suitable display unit 25.

Further, a microscope 40 is provided in such a position that the visual field of which falls on an approximate center area on the stage 22, and the objective lens of the microscope 40 through which human eye ME observes has a cross scale 41. Above the approximate center area of the stage 22 is provided a dropping device 30 of the photoresist material, and it is so disposed that the place at which droplets of the photoresist material drops from the dropping device 30 corresponds to the cross point of the scale 41.

The dropping device 30 has a nozzle, diaphragm, and piezo-electric element (not shown), and discharges the photoresist material in the state of droplets of a fixed volume by the vibration of the piezo-electirc element caused by the impression of pulse voltage. The diameter of the diffused droplets of the photoresist material dropped on the substrate 10 can be adjusted by changing the viscosity of the photoresist material, so that the minimum available coating diameter can be 50 $\mu m\Phi$.

Now, the exposure means for selectively exposing the portion which has been coated with the photoresist material by the photoresist applying device 20 will be described.

Figure 4:
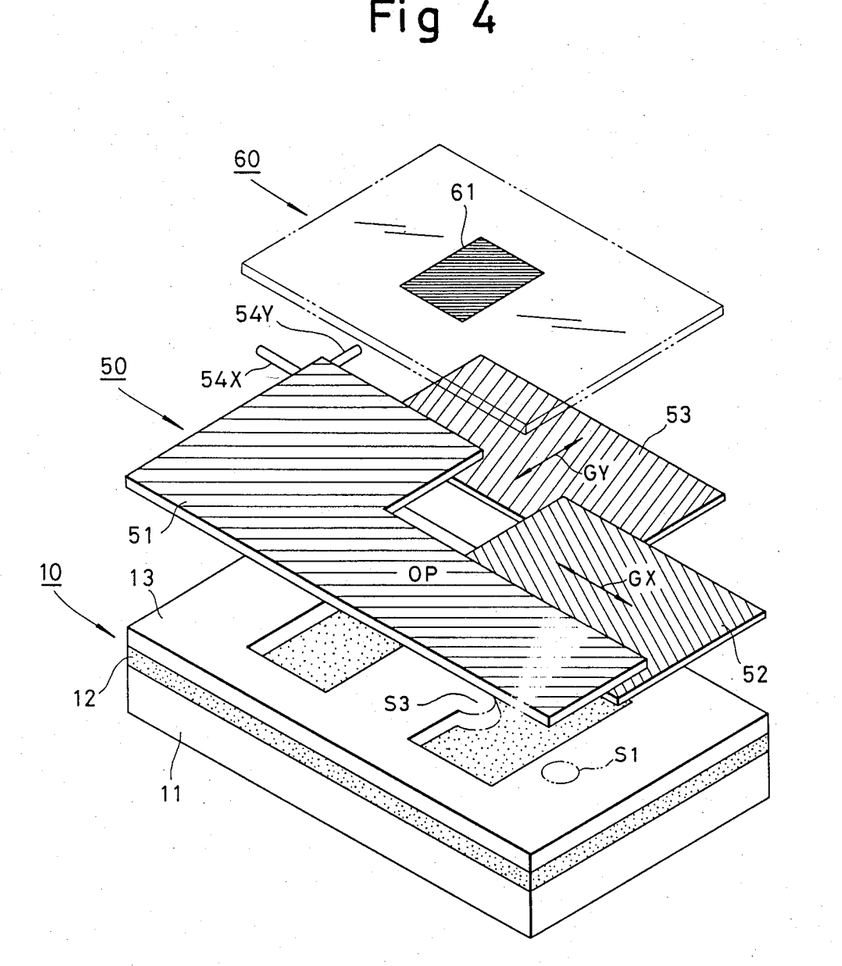
FIG. 4 is a schematic view showing a typical configuration of the correction mask means used in the present invention.

FIG. 4 illustrates an example of correction mask means for performing such selective exposure. The correction mask means comprises a mask 50 for transmitting light of only a predetermined area (hereinafter referred to as "positive type mask"), a mask 60 for shielding the light in a predetermined area (hereinafter referred to as "negative type mask"). The positive type mask 50 is comprised of a stationary plate 51 made up of an L-shape piece, a movable plate 52 movable in the direction of an arrow GX through the operation of a handle 54X, and a movable plate 53 movable in direction of an arrow GY through the operation of a handle 54Y. An opening OP is defined by each side of the movable plates 52 and 53, and inner two sides of the stationary plate 51. The size of the opening OP is adjustable by moving the movable plates 52 and 53.

The negative type mask 60 is made of transparent material allowing the light to be transmitted for exposure, and around the center portion thereof is formed a light shielding part 61 of suitable size.

Figure 6:
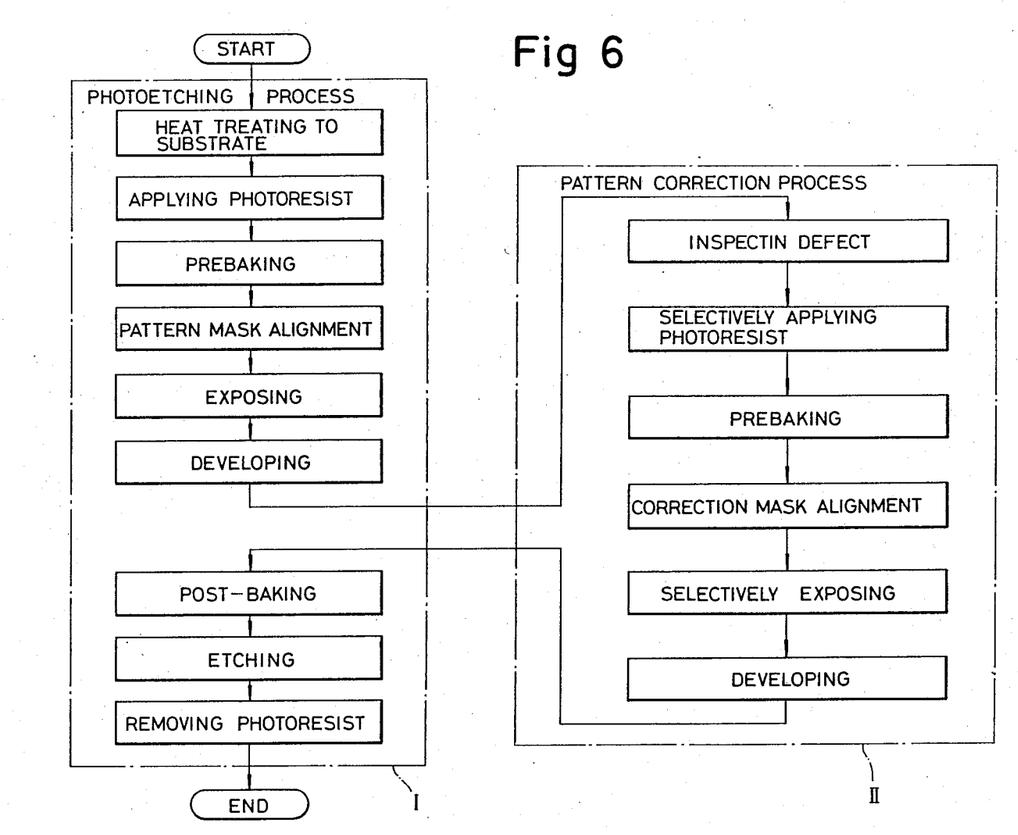
FIG. 6 is a flowchart showing the steps of the pattern correction process according to the present invention.

Now, the pattern correction method according to the present invention will be described taking the correction of defects D1 through D5 shown in FIG. 2 (A) for example. FIG. 6 shows a flowchart of correction steps in a simplified form. Block I of the flowchart is prior art photoetching steps, and block II is the correction steps according to the present invention.

Figure 5:
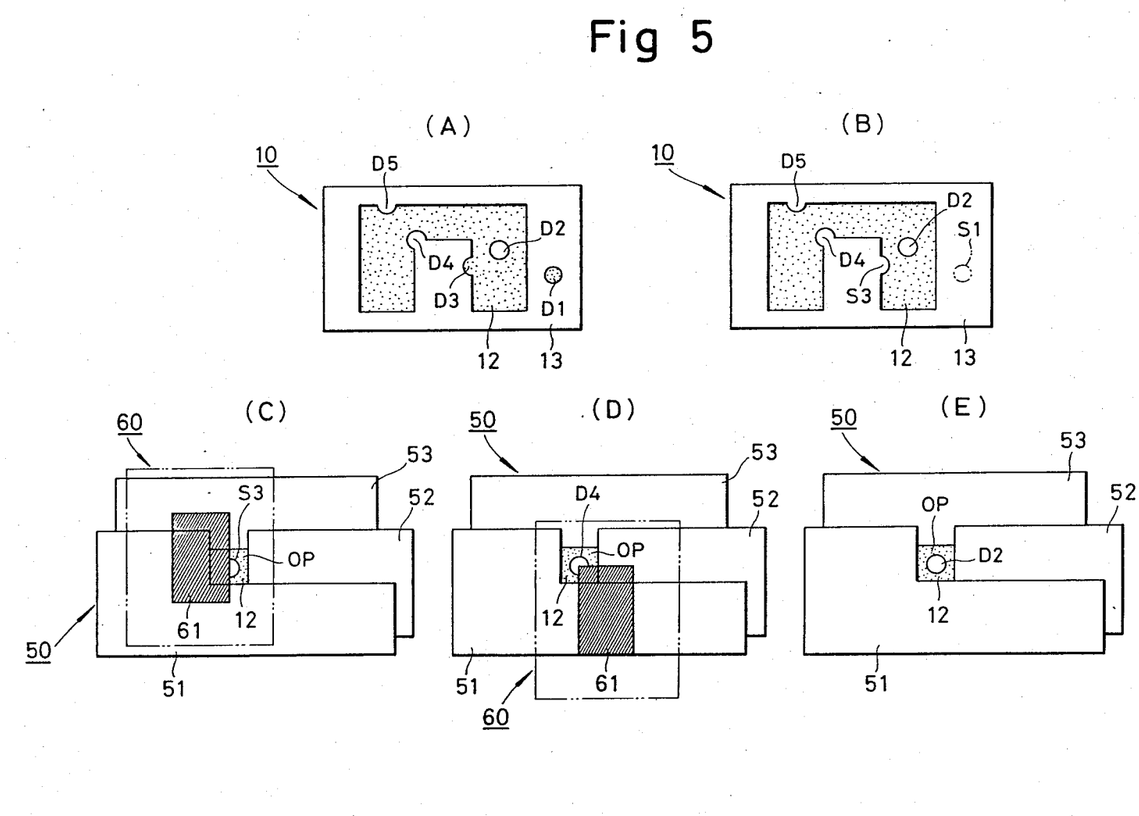

Plane views of defects D1 through D5 of FIG. 2 (A) are as shown in FIG. 5 (A). The state shown in FIG. 5 (A) corresponds to the stage in FIG. 1 (E) where coating with photoresist material, prebaking, exposure, and development processes have already been completed (refer to FIG. 6).

The substrate 10 is examined by a flaw testing equipment (not shown), and data on whether or not defects exist and the positions of defects if existed are obtained. The position data area, for example, represented by the coordinates (x,y) with a mark TM to be used for the alignment of the masks (refer to FIG. 3) of the substrate 10 being their origin. Application of photoresist material for correction can be easily performed by the following steps: (1) bringing diminishing scale of the coordinates (X,Y) at dropping point of the photoresist dropping device 30 of the photoresist applying equipment to correspond with the coordinates (x,y), (2) taking the registration mark TM as the origin of the coordinates (X,Y), and (3) performing parallelism adjustment while placing the substrate 10 on the stage 22 in the same orientation as it is set on the flaw testing equipment.

FIG. 5 (B) shows the substrate 10 after correction. As shown in the drawing, of the defects D1 through D5, the correcting photoresist is dropped selectively only on the defects D1 and D3 (hereinafter referred to as "negative type defect"). The substrate 10 thus corrected is subjected to prebaking as in the prior art process.

The substrate 10, thus prebaked is subjected to selective exposure by the corrective mask means. Which of the positive mask 50 and the negative mask 60 is to be used depends on the type of defect. The correction part S3 (refer to FIG. 5 (B)) of D3 is then masked, as shown in FIG. 5 (C), first by the positive type mask 50, and then masked by the negative type mask 60 so that the correction part S3 is allowed to be exposed, and exposure is performed. Similar steps are taken for the defect D4 (refer to FIG. 5 (D)).

For the defect D2, exposure is performed using only the positive mask 50 (refer to FIG. 5 (E)).

For the defect D1, since the correcting photoresist is applied to make a correction part S1, no exposure is required.

After the above selective exposure is performed, the development of the substrate 10 is executed. As a result, defects D2, D4, and D5, and correction part S3 (hereinafter referred to generally as "positive type flaws") are removed, and, since defect D1 has already been corrected, removal of the whole photoresist pattern defects are completed as shown in FIG. 1 (E).

Although the above example shows when the positive photoresist layer 13 is used, the procedure is the same when the negative type photoresist layer 13N is used. In this case, developer is the positive type developer. The following is a correction procedure when the negative type photoresist is used.

For the defect D1, dropping the positive type photoresist material for correction is all that is required. For the defect D3, the photoresist material is similarly dropped, and the correction part D3 is corrected in the same manner as described above. Since the negative type photoresist layer 13N is insoluble to the negative type developer, other patterns are not affected.

Regarding the defects D2, D4, and D5, when these are defects caused by improper development, those can be corrected by performing development using the negative type developer again. When these defects are the result of exposure failure, for example, the result of misradiation due to the use of a defective mask 14N, the defects cannot be corrected, and the whole photoresist pattern should be formed anew (refer to FIG. 1 (D)). In other words, the correction of photoresist pattern by the negative type photoresist material can be made within limited cases, and there are defects that cannot be corrected. On the other hand, by using the positive type photoresist material there is no defect in the resist pattern that cannot be corrected. That is, the present invention is particularly effective in the correction of photoresist patterns by using the positive type photoresist material. Though the negative type photoresist material may be used for correction, the use of positive type photoresist material can perform favorable correction without correction failure, and makes possible overall correction.

Furthermore, though in the above embodiment, the negative mask 60 is disposed over the positive mask 50, the arrangement may be reversed if the desired pattern can be obtained. In addition, with positive type masks having the opening OP of various forms, and negative type shielding part 61 of various forms, suitable combination or these masks, or the combination of these and the masks 14 and 14N shown in FIG. 1 (C) and (D) may be used.

What is claimed is:

1. A process of forming a photoresist pattern on a film material to be photo-etched, comprising steps of:
   covering said film material with a light sensitive photoresist layer;
   exposing said photoresist layer to light through first light shielding means on which a desired photo-etching pattern is formed;
   developing the light-exposed photoresist layer using a suitable developer to form a photoresist pattern corresponding to said desired photoetching pattern; and
   detecting a defective part in the photoresist pattern and correcting the defective part by conducting a partial treatment on said photoresist pattern, characterized in that said partial treatment has the steps of:
   dropping a photoresist material onto said defective part of the photoresist pattern so as to selectively coat said defective part with said photoresist material, said defective part of the photoresist pattern including a defect adjacent the apex of an L-shaped region,
   exposing the selectively coated part to light through second light shielding means comprising a plurality of positive type masks for shielding all but a predetermined rectilinear portion from light irradiation and a single negative type mask positioned to permit light to pass through all but a rectilinear subregion of said predetermined portion, said single negative type mask consisting of a planar member which is transparent but includes a rectilinear opaque region, said negative type mask being positioned with respect to the positive type masks so that said opaque regions covers said rectilinear subregion of said predetermined portion, whereby light is permitted to pass only through the resulting generally L-shaped opening, said masks being situated so that light passing through said L-shaped opening will selectively expose said dropped photoresist in an L-shaped area coinciding with said L-shaped defect containing region, and
   developing said part so as to obtain a desired photoresist pattern.

2. A process of forming a photoresist pattern on a film material to be photo-etched, comprising steps of:
   covering said film material with a light sensitive photoresist layer;
   exposing said photoresist layer to light through first light shielding means on which a desired photo-etching pattern is formed;
   developing the light-exposed photoresist layer using a suitable developer to form a photoresist pattern corresponding to said desired photoetching pattern; and
   detecting a defective part in the photoresist pattern and correcting the defective part by conducting a partial treatment on said photoresist pattern, characterized in that said partial treatment has the steps of:
   dropping a photoresist material onto said defective part of the photoresist pattern so as to selectively coat said defective part with said photoresist material, said dropping being accomplished by discharging said photoresist material in the state of droplets of a fixed volume by the vibration of a piezo-electric element to which a pulse voltage is impressed, said defective part of the photoresist pattern including a defect adjacent the apex of an L-shaped region,
   exposing the selectively coated part to light through second light shielding means comprising a plurality of positive type masks for shielding all but a predetermined rectilinear portion from light irradiation and a single negative type mask positioned to permit light to pass through all but a rectilinear subregion of said predetermined portion, said single negative type mask consisting of a planar member which is transparent but includes a rectilinear opaque region, said negative type mask being positioned with respect to the positive type masks so that said opaque region covers said rectilinear subregion of said predetermined portion, whereby light is permitted to pass only through the resulting generally L-shaped opening, said masks being situated so that light passing through said L-shaped opening will selectively expose said dropped photoresist in an L-shaped area coinciding with said L-shaped defect containing region, and
   developing said part so as to obtain a desired photoresist pattern.

3. A process of forming a photoresist pattern on a film material to be photo-etched, comprising steps of:
   covering said film material with a light sensitive photoresist layer;
   exposing said photoresist layer to light through first light shielding means on which a desired photo-etching pattern is formed;
   developing the light-exposed photoresist layer using a suitable developer to form a photoresist pattern corresponding to said desired photoetching pattern; and
   detecting a defective part in the photoresist pattern and correcting the defective part by conducting a partial treatment on said photoresist pattern, characterized in that said partial treatment has the steps of:
   dropping a photoresist material onto said defective part of the photoresist pattern so as to selectively coat said defective part with said photoresist material, said dropping being accomplished by discharging said photoresist material in the state of droplets of a fixed volume by the vibration of a piezo-electric element to which a pulse voltage is impressed,
   exposing the selectively coated part to light through second light shielding means comprising a plurality of positive type masks for shielding all but a predetermined rectilinear portion from light irradiation and a single negative type mask positioned to permit light to pass through all but a rectilinear subregion of said predetermined portion, said exposing step comprising:
   positioning a plurality of positive type masks to shield from light irradiation all but a predetermined rectilinear portion of said selectively coated part,
   positioning a negative type mask having a transparent region and a rectilinear opaque region so that said opaque region blocks a subregion of said predetermined rectilinear portion, thereby establishing a generally L-shaped opening, and passing light through said generally L-shaped opening to irradiate said dropped photoresist material, the resultantly developed photoresist pattern thereby covering a defect occurring adjacent an apex of an L-shaped region of said desired photoetching pattern.

* * * * *